(12) United States Patent
Nishimura et al.

(10) Patent No.: US 6,791,391 B2
(45) Date of Patent: Sep. 14, 2004

(54) LEVEL SHIFTING CIRCUIT

(75) Inventors: Hidetoshi Nishimura, Osaka (JP); Masahiro Gion, Mukou (JP); Heiji Ikoma, Ikoma-gun (JP); Naoki Nojiri, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/193,442

(22) Filed: Jul. 10, 2002

(65) Prior Publication Data

US 2003/0011418 A1 Jan. 16, 2003

(30) Foreign Application Priority Data

Jul. 16, 2001 (JP) ........................................ 2001-215571

(51) Int. Cl.[7] ............................................... H03L 5/00
(52) U.S. Cl. ........................ 327/333; 327/537; 326/68
(58) Field of Search ................................. 327/333, 534, 327/537, 427, 538, 540, 541, 543, 581; 326/68–72, 80, 81

(56) References Cited

U.S. PATENT DOCUMENTS

| | | | | |
|---|---|---|---|---|
| 4,408,136 A | * | 10/1983 | Kirsch | 326/70 |
| 4,486,670 A | * | 12/1984 | Chan et al. | 326/81 |
| 5,559,464 A | * | 9/1996 | Orii et al. | 327/333 |
| 6,320,408 B1 | * | 11/2001 | Kwong | 326/31 |

FOREIGN PATENT DOCUMENTS

JP 5-191170 7/1993

* cited by examiner

*Primary Examiner*—Long Nguyen
(74) *Attorney, Agent, or Firm*—Merchant & Gould P.C.

(57) ABSTRACT

In a CMOS level shifting circuit including N-channel transistors that have sources to which a digital signal is supplied, a bias voltage Vref is supplied to gates of the N-channel transistors, and the bias voltage Vref is set to be higher than a high level voltage of the digital signal and lower than a value obtained by adding a threshold voltage of the N-channel transistors to the high level voltage of the digital signal. Thus, a level shifting circuit is provided that is capable of outputting a signal having subjected to stable level conversion, even when a voltage level of a low voltage signal is lowered.

2 Claims, 4 Drawing Sheets

LEVEL SHIFTING CIRCUIT

BACKGROUND OF THE INVENTION

1. Field of the Invention

The present invention relates generally to a level shifting circuit (level conversion circuit) that operates with a plurality of power source voltages in a semiconductor integrated circuit device.

2. Related Background Art

The following will describe a conventional level shifting circuit referring to the drawings. FIG. 4 is a circuit diagram illustrating a conventional level shifting circuit.

A level shifting circuit 100 is a circuit that is built in a LSI and shifts the level of a low voltage signal supplied from an external input terminal IN to a high voltage signal, to output the same through an external output terminal OUT. Here, the low voltage signal is a digital signal whose high level is a first power source voltage Vddl and whose low level is 0V. The high voltage signal obtained by level shifting is a digital signal whose high level is a second power source voltage Vddh and whose low level is 0V. Among power source voltages in the LSI, appropriate ones are used as the first and second power source voltages Vddl and Vddh, respectively.

In FIG. 4, 21 denotes a first inverter for a low-voltage operation, and 22 denotes a second inverter for a low-voltage operation. 23 denotes a first P-channel transistor for a high voltage operation, and 24 denotes a second P-channel transistor for a high voltage operation. Sources thereof are connected to substrates thereof. 25 denotes a first N-channel transistor for a high voltage operation, and 26 denotes a second N-channel transistor for a high voltage operation. Substrates thereof are connected to GND.

The following will describe an operation of the conventional level shifting circuit 100, while referring to FIG. 4. A case where a low voltage signal transmitted from the external input terminal IN is at a L level (0V) is described first. A low voltage signal is inverted by the first inverter 21, and a node n5 is pulled up to a H level (Vddl), which causes a voltage at the H level (Vddl) to be supplied to a source of the first N channel transistor 25. Here, since a voltage at the H level (Vddl) is applied to a gate of the first N-channel transistor 25, the first N-channel transistor 25 becomes non-conducting.

On the other hand, a signal branched at the node n5 is inverted by the second inverter 22, and a node n6 is pulled down to a L level (0V). Therefore, a voltage at the L level (0V) is applied to a source of the second N-channel transistor 26. Here, since a voltage at the H level (Vddl) is applied to a gate of the second N-channel transistor 26, the second N-channel transistor 26 becomes conducting. Therefore, a node n8 is pulled down to the L level (0V).

Furthermore, a H level (Vddh) of the high voltage signal is applied to a source of the first P-channel transistor 23, and a gate of the first P-channel transistor 23 (node n8) is at the L level (0V), thereby causing the first P-channel transistor 23 to become conducting. Therefore, a node n7 is pulled up to the H level (Vddh).

Furthermore, the H level (Vddh) of the high voltage signal is applied to a source of the second P-channel transistor 24, and a gate of the second P-channel transistor 24 (node n7) is at the H level (Vddh), thereby causing the second P-channel transistor 24 to become non-conducting. As a result, an external output terminal OUT (node n8) is stabilized at the L level (0V).

The following will describe a case where the low voltage signal supplied through the external input terminal IN is at the H level (Vddl). The low voltage signal is inverted by the first inverter 21, and the node n5 is pulled down to the L level (0V), whereby a voltage at the L level (0V) is applied to the source of the first N-channel transistor 25. Here, since a voltage at the H level (Vddl) is applied to a gate of the first N-channel transistor 25, the first N-channel transistor 25 becomes conducting. This causes the node n7 to be pulled down to the L level (0V).

Furthermore, the H level (Vddh) of the high voltage signal is applied to the source of the second P-channel transistor 24 and the gate of the second P-channel transistor 24 (node n7) is at the L level (0V), thereby causing the second P-channel transistor 24 to become conducting. Therefore, the node n8 is pulled up to the H level (Vddh).

On the other hand, the signal branched at the node n5 is inverted by the second inverter 22, and the node n6 is pulled up to the H level (Vddl), thereby causing a voltage at the H level (Vddl) to be applied to the source of the second N transistor 26. Here, since a voltage at the H level (Vddl) is applied to the gate of the second N-channel transistor 26, the second N-channel transistor 26 becomes non-conducting.

Furthermore, a voltage at the H level (Vddh) is applied to the source of the first P-channel transistor 23, and the gate of the first P-channel transistor 23 (node n8) is at the H level (Vddh), thereby causing the first P-channel transistor 23 to become conducting. This causes the external output terminal OUT (node n8) to be stabilized at the H level (Vddh).

Thus, the conventional level shifting circuit 100 is capable of carrying out the level conversion with respect to a low voltage signal supplied thereto and outputting a high voltage signal.

In the aforementioned level shifting circuit 100, it is necessary to lower a power source voltage inside a LSI in the case where a withstand voltage of a transistor lowers as the power consumption of electronic devices is lowered as demanded and the micromachining is promoted in the manufacturing process. However, if the first power source voltage Vddl becomes lower than 1.5V, a propagation delay time from the input to the output to/from the level shifting circuit 100 increases significantly. This is because the time required for charging the gates of the first and second N-channel transistors 25 and 26 increases if the power source voltage Vddl is lowered.

Furthermore, in the case where the power source voltage Vddl is lowered to approximately 1.0V, the first and second N-channel transistors 25 and 26 cannot operate. This is because the power source voltage Vddl supplied to the gate of the first or second N-channel transistor 25 or 26 approaches the threshold voltage for the first and second N-channel transistors 25 and 26. Thus, the conventional level shifting circuit 100 has a drawback in that it does not function in the case where the power source voltage Vddl is lowered excessively.

SUMMARY OF THE INVENTION

Therefore, with the foregoing in mind, it is an object of the present invention to provide a level shifting circuit that outputs a signal that has been subjected to stable level conversion, even when a voltage level of a low voltage signal lowers.

A level shifting circuit of the present invention is a CMOS level shifting circuit including a N-channel transistor that has a source to which a digital signal is supplied. In the CMOS level shifting circuit, a bias voltage is supplied to a gate of the N-channel transistor, and the bias voltage is set to be higher than a high level voltage of the digital signal and lower than a value obtained by adding a threshold voltage of the N-channel transistor to the high level voltage of the digital signal. This allows the N-channel transistor to operate even when the digital signal is at a low voltage level, and hence, makes it possible to provide a level shifting circuit capable of carrying out level conversion of an input signal and outputting a result.

The bias voltage preferably is one of power source voltages. This allows the N-channel transistor to operate by using a power source voltage that is already available, without applying an additional voltage.

A level shifting circuit of the present invention is a CMOS level shifting circuit including a first N-channel transistor, a second N-channel transistor, a first P-channel transistor, and a second P-channel transistor. In the CMOS level shifting circuit, a drain of the first N-channel transistor is connected to a drain of the first P-channel transistor and a gate of the second P-channel transistor, and a drain of the second N-channel transistor is connected to a drain of the second P-channel transistor, a gate of the first P-channel transistor, and an external output terminal. An inverted signal of a digital signal is supplied to a source of the first N-channel transistor, the digital signal being supplied via the external input terminal and having a high level and a low level that are a first power source voltage and a ground voltage, respectively, and the digital signal is supplied to a source of the second N-channel transistor. Furthermore, a bias voltage is supplied to gates of the first and second N-channel transistors. The bias voltage is higher than the first power source voltage and lower than a value obtained by adding a threshold voltage of the first and second N-channel transistors to the first power source voltage. On the other hand, a second power source voltage is supplied to sources of the first and second P-channel transistors. This allows the first and second N-channel transistors to operate, even when the first power source voltage is low. Thus, this makes it possible to provide a level shifting circuit that is capable of carrying out level conversion of an input signal and outputting a result even when the first power source voltage is low.

Preferably, a third power source voltage that is higher than both of the first power source voltage and the second power source voltage is used as the bias voltage. This allows the N-channel transistor to operate by using a power source voltage that is already available, without applying an additional voltage, even when a difference between the first and second power source voltages is small.

Furthermore, the bias voltage preferably is an output of an intermediate voltage generating circuit, and the intermediate voltage generating circuit is a source follower circuit including a third P-channel transistor whose gate is connected to the first power source voltage. This makes it possible to generate the bias voltage at a desired level, without increasing the number of power source voltages used.

Furthermore, preferably, a voltage applied to a substrate of the first N-channel transistor and a voltage applied to a substrate of the second N-channel transistor are not higher than a ground voltage, and one or both of the voltages are lower than the ground voltage. This lowers the threshold voltage when the first and second N-channel transistors are conducting, thereby achieving an improved operation speed, while it raises the threshold voltage when they are non-conducting, thereby decreasing a leakage current, which results in low power consumption.

Furthermore, preferably, the voltage applied to the substrate of the first N-channel transistor is lower than the ground voltage when the first N-channel transistor is conducting, and it is equal to the ground voltage when the first N-channel transistor is non-conducting. Besides, the voltage applied to the substrate of the second N-channel transistor is lower than the ground voltage when the second N-channel transistor is conducting, and it is equal to the ground voltage when the second N-channel transistor is non-conducting. This further lowers the threshold voltage when the first and second N-channel transistors are conducting, thereby achieving an improved operation speed, while it further raises the threshold voltage when they are non-conducting, thereby decreasing a leakage current, which results in low power consumption.

DETAILED DESCRIPTION OF THE INVENTION

First Embodiment

Figure 1:
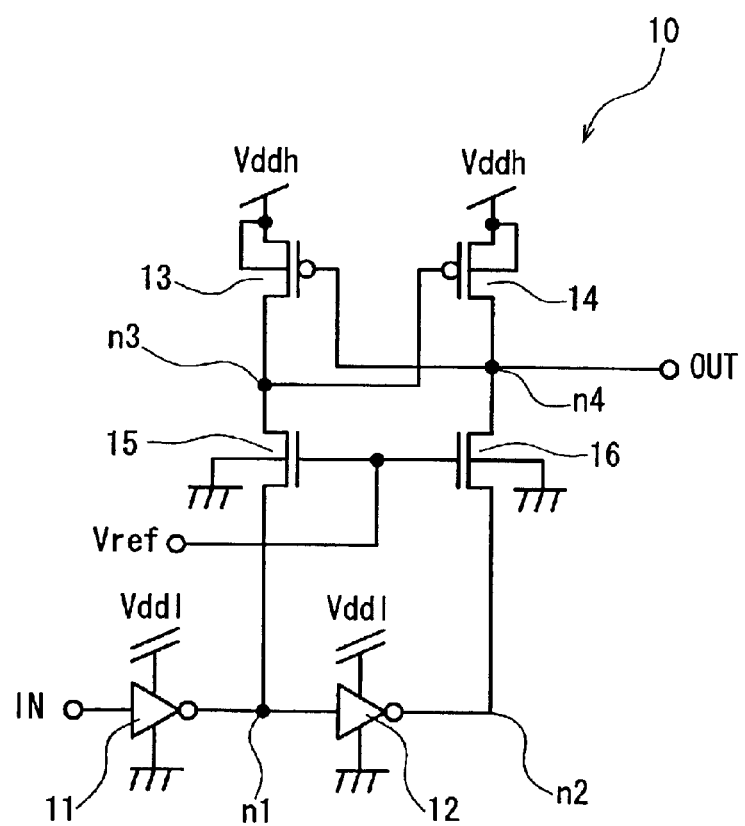
FIG. 1 is a circuit diagram illustrating a level shifting circuit according to a first embodiment of the present invention.

The following will describe a level shifting circuit according to a first embodiment of the present invention, while referring to the drawings. FIG. 1 is a circuit diagram illustrating a level shifting circuit according to the first embodiment of the present invention.

A level shifting circuit 10, which is built in a LSI and is composed of complementary metal-oxide semiconductors (CMOS), carries out level shifting with respect to a level of a low voltage signal supplied via an external input terminal IN to a high voltage signal, and outputs the same via an external output terminal OUT. Here, a low voltage signal is a digital signal whose high level is a first power source voltage Vddl and whose low level is 0V. The high voltage signal obtained by level shifting is a digital signal whose high level is a second power source voltage Vddh and whose low level is 0V. Among power source voltages in the LSI, appropriate ones are used as the first and second power source voltages Vddl and Vddh, respectively.

11 denotes a first inverter for a low-voltage operation, and 12 denotes a second inverter for a low-voltage operation. 13 denotes a first P-channel transistor for a high voltage operation, and 14 denotes a second P-channel transistor for a high voltage operation. Substrates thereof are connected to sources thereof. 15 denotes a first N-channel transistor for a high voltage operation, and 16 denotes a second N-channel transistor for a high voltage operation. Substrates thereof are connected to GND.

The external input terminal IN is connected to an input side of the first inverter 11. An output side of the first inverter 11 is branched at a node n1, with one being connected to a source of the first N-channel transistor 15, and the other being connected to an input side of the second inverter 12. An output side of the second inverter 12 is connected to a source of the second N-channel transistor 16 via a node n2. An intermediate voltage Vref is applied to gates of the first and second N-channel transistors 15 and 16. The intermediate voltage Vref is a voltage satisfying a relationship of Vddl<Vref<Vddl+Vtn, where Vtn is a threshold voltage of the first and second N-channel transistors.

A drain of the first N-channel transistor 15 is connected to a drain of the first P-channel transistor 13 and a gate of the second P-channel transistor 14 via a node n3. A drain of the second N-channel transistor 16 is connected to a drain of the second P-channel transistor 14, a gate of the first P-channel transistor 13, and the external output terminal OUT via a node n4. A second power source voltage Vddh is applied to sources of the first and second P-channel transistors 13 and 14.

The following will describe an operation of the level shifting circuit 10 as described above according to the first embodiment. A case where the low voltage signal supplied via the external input terminal IN is at the L level (0V) is described first. The low voltage signal is inverted by the first inverter 11, and the node n1 is pulled up to the H level (Vddl), thereby causing a voltage at the H level (Vddl) to be applied to the source of the first N-channel transistor 15. Here, since the intermediate voltage Vref is applied to the gate of the first N-channel transistor 15, a gate-source voltage of the first N-channel transistor 15 is Vref−Vddl, and the relationship of Vref−Vddl<Vtn is satisfied. Since the gate-source voltage is lower than the threshold voltage Vtn, the first N-channel transistor 15 becomes non-conducting.

On the other hand, a signal branched at the node n1 is inverted by the second inverter 12, and the node n2 is pulled down to the L level (0V), thereby causing a voltage at the L level (0V) to be applied to the source of the second N-channel transistor 16. Here, since the intermediate voltage Vref is applied to the gate of the second N-channel transistor 16, a gate-source voltage of the second N-channel transistor 16 is Vref−0V, and the relationship of Vref−0V>Vtn is satisfied. Since the gate-source voltage is higher than the threshold voltage Vtn, the second N-channel transistor 16 becomes conducting. This causes the node n4 to be pulled down to the L level (0V).

Furthermore, the H level (Vddh) of the high voltage signal is applied to the source of the first P-channel transistor 13, and the gate of the first P-channel transistor 13 (node n4) is at the L level (0V), thereby causing the first P-channel transistor 13 to become conducting. This causes the node n3 to be pulled up to the H level (Vddh).

Furthermore, a voltage at the H level (Vddh) is applied to the source of the second P-channel transistor 14, and the gate of the second P-channel transistor 14 (node n3) is at the H level (Vddh), thereby causing the second P-channel transistor 14 to become non-conducting. This causes the external output terminal OUT (node n4) to be stabilized at the L level (0V).

Next, a case where the low voltage signal supplied via the external input terminal IN is at the H level (Vddl) is described. The low voltage signal is inverted by the first inverter 11, and the node n1 is pulled down to the L level (0V), thereby causing a voltage at the L level (0V) to be applied to the source of the first N-channel transistor 15. Here, since the intermediate voltage Vref is applied to the gate of the first N-channel transistor 15, a gate-source voltage of the first N-channel transistor 15 is Vref−0V, and the relationship of Vref−0V>Vtn is satisfied. Since the gate-source voltage is higher than the threshold voltage Vtn, the first N-channel transistor 15 become conducting. This causes the node n3 to be pulled down to the L level (0V).

Furthermore, the H level (Vddh) of the high voltage signal is applied to the source of the second P-channel transistor 14, and the gate of the second P-channel transistor 14 (node n3) is at the L level (0V), thereby causing the second P-channel transistor 14 to become conducting. This causes the node n4 to be pulled up to the H level (Vddh).

On the other hand, a signal branched at the node n1 is inverted by the second inverter 12, and the node n2 is pulled up to the H level (Vddl), thereby causing a voltage at the H level (Vddl) to be applied to the source of the second N-channel transistor 16. Here, since the intermediate voltage Vref is applied to the gate of the second N-channel transistor 16, a gate-source voltage of the second N-channel transistor 16 is Vref−Vddl, and the relationship of Vref−Vddl<Vtn is satisfied. Since the gate-source voltage is lower than the threshold voltage Vtn, the second N-channel transistor 16 become non-conducting.

Furthermore, a voltage at the H level (Vddh) is applied to the source of the first P-channel transistor 13, and the gate of the first P-channel transistor 13 (node n4) is at the H level (Vddh), thereby causing the first P-channel transistor 13 to become non-conducting. This causes the external output terminal OUT (node n4) to be stabilized at the H level (Vddh).

Thus, in the level shifting circuit 10 according to the first embodiment, the intermediate voltage Vref, which satisfies the relationship given as Vddl<Vref<Vddl+Vtn, is applied to the gates of the first and second N-channel transistors 15 and 16. Therefore, it is possible to cause the first and second N-channel transistor 15 and 16 to operate even in the case where the first power source voltage Vddl is low. This makes it possible to provide a level shifting circuit capable of stable level conversion of an input signal.

It should be noted that it is not necessary to supply the intermediate voltage Vref from the outside, but a third power source voltage may be used, which is one of power source voltages inside the LSI. The third power source voltage may be higher than the first power source voltage Vddl and lower than a value obtained by adding the threshold voltage Vtn to the first power source voltage Vddl. This makes it possible to achieve the following effect: no additional voltage is needed to be applied from the outside. Furthermore, in the case where a difference between the first power source voltage Vddl and the second power source voltage Vddh is small, the third power source voltage may be set to be greater than both of the first and second power source voltages Vddl and Vddh.

Second Embodiment

Figure 2:
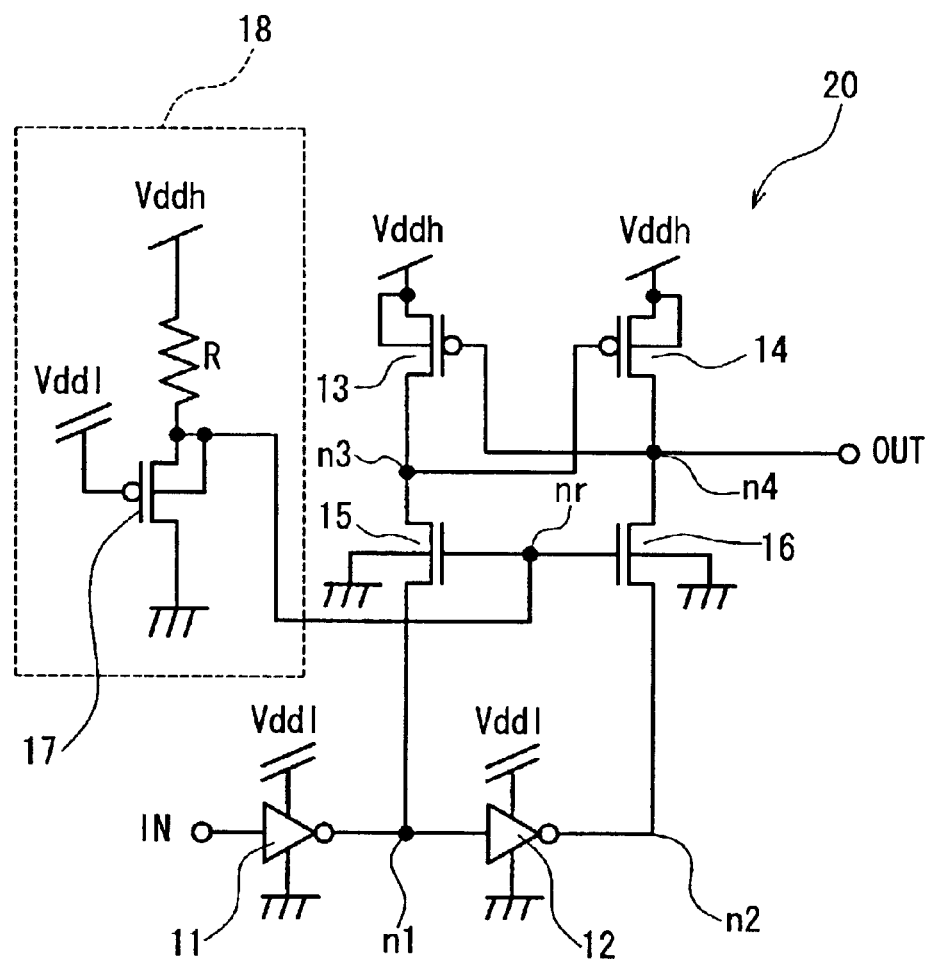
FIG. 2 is a circuit diagram illustrating a level shifting circuit according to a second embodiment of the present invention.

The following will describe a level shifting circuit according to a second embodiment of the present invention, while referring to the drawings. FIG. 2 is a circuit diagram illustrating a level shifting circuit according to the second embodiment of the present invention. It should be noted that the same members as those in FIG. 1 are designated by the same reference numerals.

A level shifting circuit 20 according to the second embodiment has the same configuration as that of the level shifting circuit 10 of the first embodiment shown in FIG. 1 except that an intermediate voltage generating circuit 18 is added.

The intermediate voltage generating circuit 18 is a source follower circuit composed of a third P-channel transistor 17 and a resistor R.

A source of the third P-channel transistor 17 is grounded. The first power source voltage Vddl is applied to a gate of the third P-channel transistor 17. The second power source voltage Vddh is applied to a drain of the third P-channel transistor 17 via the resistor R. Furthermore, a substrate thereof and the drain are connected. The drain of the third P-channel transistor 17 is connected to the gates of the first and second N-channel transistors 15 and 16 via a node nr.

The intermediate voltage generating circuit 18 generates the intermediate voltage Vref based on two power source voltages Vddl and Vddh. The intermediate voltage Vref supplied from the intermediate voltage generating circuit 18 is applied to the gates of the second N-channel transistors 15 and 16 via the node nr. An output of the intermediate voltage generating circuit 18 is expressed as Vddl+|Vtp|, where Vtp represents a threshold voltage of the third P-channel transistor 17. Here, when a transistor size of the third P-channel transistor 17 is set so that |Vtp|<Vtn is satisfied, the relationship given as Vddl<Vddl+|Vtp|<Vddl+Vtn is satisfied. With this configuration, the intermediate voltage generating circuit 18 is capable of outputting the intermediate voltage Vref described in conjunction with the first embodiment.

As described above, the level shifting circuit according to the second embodiment includes the intermediate voltage generating circuit 18 that employs two power source voltages to generate the intermediate voltage Vref. Therefore, it is possible to operate the first and second N-channel transistors 15 and 16 without applying an additional voltage from the outside, even when the first power source voltage Vddl is lowered. As a result, it is possible to implement a level shifting circuit capable of stable level conversion of an input signal.

Third Embodiment

Figure 3:
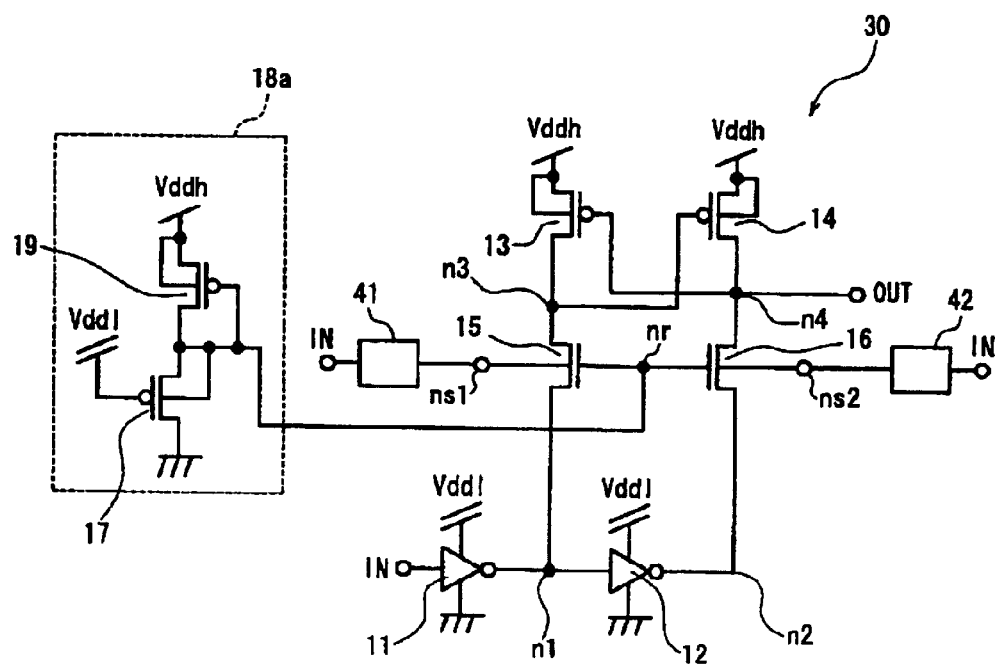
FIG. 3 is a circuit diagram illustrating a level shifting circuit according to a third embodiment of the present invention.
Figure 4:
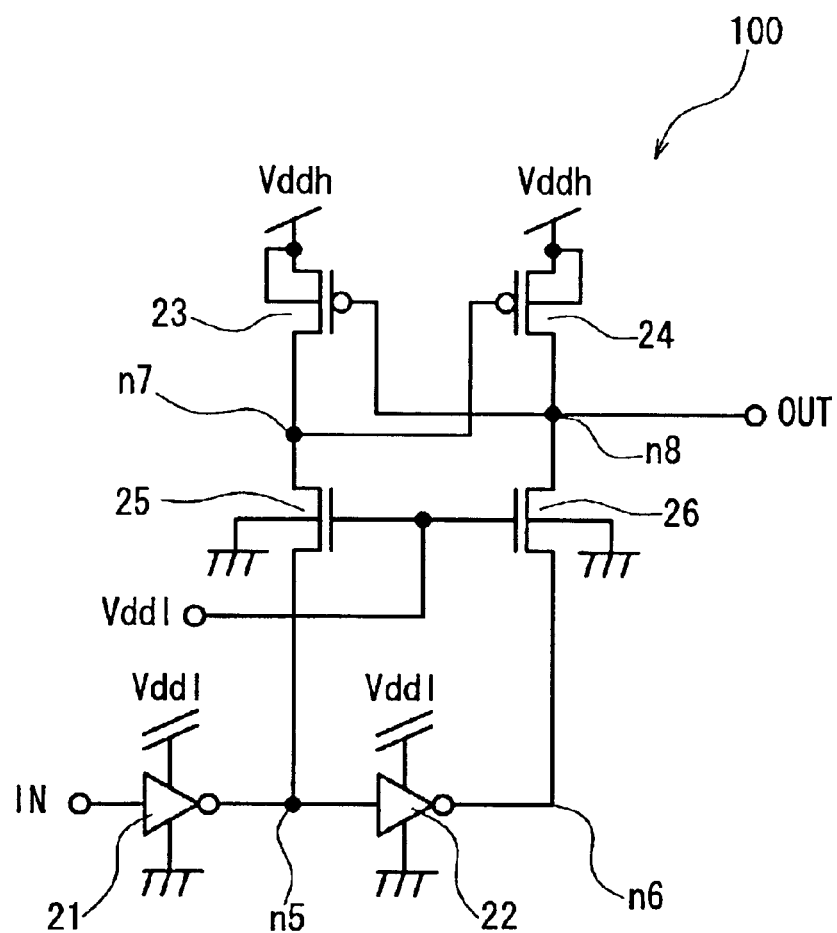
FIG. 4 is a conventional level shifting circuit.

The following will describe a level shifting circuit according to the third embodiment of the present invention, while referring to the drawings. FIG. 3 is a circuit diagram illustrating a level shifting circuit according to the third embodiment of the present invention. It should be noted the same members as those shown in FIGS. 1 and 2 are designated by the same reference numerals.

A level shifting circuit 30 of the third embodiment has the same configuration as that of the level shifting circuit 10 of the first embodiment except that an intermediate voltage generating circuit 18a for supplying an intermediate voltage is added, which is different from the intermediate voltage generating circuit 18 of the second embodiment, and that terminals ns1 and ns2 as the substrates of the first and second N-channel transistors 15 and 16 are connected to GND or a potential lower than the GND. In other words, voltages not higher than GND are applied to the substrates of the first and second N-channel transistors 15 and 16 of the level shifting circuit 30. A body biasing circuit 41 is a circuit that is connected with the terminal ns1 so as to apply a voltage to the terminal ns1. A body biasing circuit 42 is a circuit that is connected with the terminal ns2 so as to apply a voltage to the terminal ns2.

The application of voltages not higher than GND to the substrates of the first and second N-channel transistors 15 and 16 causes a back bias effect (substrate bias effect) in the first and second N-channel transistors 15 and 16. More specifically, the threshold voltage Vtn increases in the case where a potential difference between the source and the substrate of the N-channel transistor is great, whereas the threshold voltage Vtn decreases in the case where a potential difference between the source and the substrate is small.

When the levels of the substrates of the first and second N-channel transistors 15 and 16 are fixed to GND, the application of voltages at the L level (0V) to the sources of the first and second N-channel transistors 15 and 16 causes the threshold voltage Vtn to lower. Here, since the first and second N-channel transistors 15 and 16 are conducting, an operation speed is increased.

In contrast, in the case where voltages at the H level (Vddl) are applied to the sources of the first and second N-channel transistors 15 and 16, the threshold voltage Vtn increases. Here, since the first and second N-channel transistors 15 and 16 are non-conducting, leakage current decreases, thereby lowering the power consumption.

Furthermore, in the case where voltages applied to the substrates of the first and second N-channel transistors 15 and 16 are not fixed but varied so as to be GND or lower than GND, the performance is improved further. More specifically, in the case where voltages applied to the substrates of the first and second N-channel transistors 15 and 16 in a conducting state are set to be GND and voltages applied to the substrates of the first and second N-channel transistors 15 and 16 in a non-conducting state are set to be lower than GND, it is possible to achieve significant improvement of the operation speed in a conducting state and a significant decrease in the power consumption in a non-conducting state. Therefore, in such a case, the level shifting circuit has high performance.

The intermediate voltage generating circuit 18a has the same configuration as that of the intermediate voltage generating circuit 18 of the second embodiment except that a fourth P-channel transistor 19 is provided in place of the resistor R so as to be connected to the third P-channel transistor 17. A first power source voltage Vddl is applied to the gate of the third P-channel transistor 17, the source thereof is grounded, and the substrate thereof and the drain thereof are connected. Furthermore, a substrate and a source of the fourth P-channel transistor 19 are connected, to which a second power source voltage Vddh is applied. A gate of the fourth P-channel transistor 19 is connected to a drain thereof, and further, to the drain and the substrate of the third P-channel transistor 17. The drain of the third P-channel transistor 17 is connected with the gates of the first and second N-channel transistors 15 and 16 via the node nr.

The intermediate voltage generating circuit 18a employs the fourth P-channel transistor 19 in place of the resistor R in the second embodiment, thereby being capable of causing the intermediate voltage Vref to be generated at the node nr, with respect to the intermediate voltage generating circuit 18 described in conjunction with the second embodiment.

Therefore, the intermediate voltage Vref is generated based on two power source voltages, and consequently, it is possible to operate the first and second N-channel transistors 15 and 16 even in the case where the first power source voltage Vddl is lowered.

As described above, the level shifting circuit of the present invention is a CMOS level shifting circuit in which a digital signal is transmitted to a source of a N-channel transistor. In the level shifting circuit, a bias voltage is supplied to a gate of the N-channel transistor, and the bias voltage is set so as to be higher than a high level voltage of the digital signal and lower than a value obtained by adding a threshold voltage of the N-channel transistor to the high level voltage of the digital signal. Therefore, the N-channel transistor is allowed to operate even when the voltage of the digital signal is lowered. Consequently, it is possible to provide a level shifting circuit capable of stable level conversion of an input signal.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A CMOS level shifting circuit comprising a first N-channel transistor, a second N-channel transistor, a first P-channel transistor, and a second P-channel transistor, wherein a drain of the first N-channel transistor is connected to a drain of the first P-channel transistor and a gate of the second P-channel transistor, a drain of the second N-channel transistor is connected to a drain of the second P-channel transistor, a gate of the first P-channel transistor, and an external output terminal, an inverted signal of a digital signal is supplied to a source of the first N-channel transistor, the digital signal being supplied via an external input terminal and having a high level and a low level that are a first power source voltage and a ground voltage, respectively, the digital signal is supplied to a source of the second N-channel transistor, a bias voltage is supplied to gates of the first and second N-channel transistors, the bias voltage being higher than the first power source voltage and lower than a value obtained by adding a threshold voltage of the first and second N-channel transistors to the first power source voltage, a second power source voltage is supplied to sources of the first and second P-channel transistors, a voltage applied to a substrate of the first N-channel transistor and another voltage applied to a substrate of the second N-channel transistor are not higher than the ground voltage, first and second body biasing circuits for providing the voltage and the another voltage to the bodies of the first and second N-channel transistors, respectively, wherein the voltage applied to the substrate of the first N-channel transistor is set to be lower than the ground voltage when the first N-channel transistor is in a conducting state, and is equal to the ground voltage when the first N-channel transistor is non-conducting, and the another voltage applied to the substrate of the second N-channel transistor is set to be lower than the ground voltage when the second N-channel transistor is in a conducting state, and is equal to the ground voltage when the second N-channel transistor is non-conducting.

2. The CMOS level shifting circuit according to claim 1, wherein the bias voltage is an output of an intermediate voltage generating circuit, the intermediate voltage generating circuit being a source follower circuit including a third P-channel transistor whose gate is connected to the first power source voltage.

* * * * *